United States Patent
Kono

[11] Patent Number: 5,929,722
[45] Date of Patent: Jul. 27, 1999

[54] LOW-PASS FILTER LAMINATED WITH A POWER DETECTION COIL

[75] Inventor: Toshihiko Kono, Tokyo, Japan

[73] Assignee: TDK Corporation, Tokyo, Japan

[21] Appl. No.: 08/976,176

[22] Filed: Nov. 21, 1997

[30] Foreign Application Priority Data

Nov. 22, 1996 [JP] Japan ................................... 8-312404

[51] Int. Cl.⁶ .................................................. H03H 7/09
[52] U.S. Cl. ........................................... 333/177; 333/185
[58] Field of Search ................................ 333/134, 177, 333/184, 185

[56] References Cited

U.S. PATENT DOCUMENTS 5,783,976  7/1998  Furutani et al. ...................... 333/134

FOREIGN PATENT DOCUMENTS 4-196804  7/1992  Japan ................................... 333/177

Primary Examiner—Robert Pascal
Assistant Examiner—Justin P. Bettendorf
Attorney, Agent, or Firm—Oblon, Spivak, McClelland, Maier & Neustadt, P.C.

[57] ABSTRACT

A low-pass filter having, a parallel circuit of a first coil and a first capacitor disposed between an input terminal and an output terminal; and a second capacitor disposed between the input terminal and ground. Also included is a third capacitor disposed between the output terminal and ground, and a power detection coil magnetically coupled to the first coil, both ends of which are detection signal output terminals. Therefore, the low-pass filter enables a decrease in the number of mounted parts in a high-frequency transmission circuit of a digital portable telephone, thereby miniaturizing the circuit and reducing the costs.

17 Claims, 5 Drawing Sheets

PRIOR ART

PRIOR ART 5,929,722

LOW-PASS FILTER LAMINATED WITH A POWER DETECTION COIL

BACKGROUND OF THE INVENTION

This invention relates to a low-pass filter used with a high-frequency transmission circuit of a digital portable telephone.

As shown in FIG. 3, in a high-frequency transmission circuit of a digital portable telephone, a voice modulation signal 20 is mixed with a high-frequency signal from a voltage-controlled oscillator 21 by a mixer 22, the mixed signal is amplified by a power amplifier 23, the output signal level of the power amplifier 23, namely, a signal responsive to transmission power (about −20 dB) is fed back into a gain control terminal of the power amplifier 23 by a transmission power detection coupler 24 for controlling the power amplifier 23 so as to maintain the transmission power at a predetermined level, and a harmonic signal occurring in the power amplifier 23 is removed through a low-pass filter 25. Then, the resultant signal is transmitted from an antenna 27 through a transmission/reception switch circuit 26 which switches between the transmission circuit and a reception circuit 28.

As shown in a circuit diagram of FIG. 4A, the conventional low-pass filter 25 comprises a parallel circuit of a coil L1 and a capacitor C1 inserted between an input terminal P1 and an output terminal P2, a capacitor C2 inserted between the input terminal P1 and ground, and a capacitor C3 inserted between the output terminal P2 and ground. As shown in a perspective view of FIG. 4B, the input terminal P1, the output terminal P2, and ground terminals G are placed on the side faces of a laminate chip 30 containing the coil L1 and the capacitors C1–C3.

FIG. 4C shows the lamination structure of the low-pass filter. The low-pass filter is manufactured by a print method or a sheet method. To use the sheet method, a dielectric layer 1a on which a ground electrode 2a is printed, a dielectric layer 1b on which capacitor electrodes 3a and 3b forming the capacitors C2 and C3 together with the ground electrode 2a are printed, a dielectric layer 1c on which a capacitor electrode 3c forming the capacitor C1 together with the capacitor electrodes 3a and 3b is printed, a plurality of dielectric layers 1d forming a gap layer, a dielectric layer 1a on which a coil 4a forming a part of the coil L1 in printed, a dielectric layer if on which a coil 4b of the remaining part of the coil L1 is printed, the dielectric layer 1f being formed with a through hole 5a for connecting an part of the coil 4b to the coil 4a, a plurality of dielectric layers 1g forming a gap layer, a dielectric layer 1h on which a ground electrode 2b is printed, and a dielectric layer 1i formed with a mark 6a and forming a surface protection layer are laminated. The laminate body is cut for each chip, then the chips are fired and the terminals P1, P2, and G are attached to the side faces of each chip, manufacturing products.

As shown in FIG. 5A, the transmission power detection coupler 24 comprises a coil L2 connected to an output line via an input terminal P3 and an output terminal P4 and a coil L3 magnetically coupled to the coil L2 and connected at both ends to detection signal output terminals P5 and P6. As shown in a perspective view of FIG. 5B, the input terminal P3, the output terminal P4, the detection signal output terminals P5 and P6, and ground terminals G are placed on the side faces of a laminate chip 31 containing the coils L2 and L3.

FIG. 5C shows the lamination structure of the coupler 24. A dielectric layer 1j on which a ground electrode 2c is printed, a plurality of dielectric layers 1k forming a gap layer, a dielectric layer 1m on which a leader electrode 4c of the coil L2 is printed, a dielectric layer 1n on which a coil 4d as the main part of the coil L2 is printed, the dielectric layer 1n being formed with a through hole 5b for connecting an end part of the coil 4d to the leader electrode 4c, a dielectric layer 1p on which a coil 4e as the main part of the coil L3 is printed, a dielectric layer 1q on which a leader electrode 4f of the coil L3 is printed, the dielectric layer 1q being formed with a through hole 5c for connecting an and part of the leader electrode 4f to the coil 4e, a plurality of dielectric layers 1r forming a gap layer, a dielectric layer 1s an which a ground electrode 2d is printed, and a dielectric layer 1t formed with a mark 6b and forming a surface protection layer are laminated. The laminate body is cut for each chip, then the chips are fired and the terminals P3–P6 and G are attached to the side faces of each chip, manufacturing products.

An described above, in the high-frequency transmission circuit of the conventional digital portable telephone, the low-pass filter 25 and the coupler 24 are formed separately, thus inhibiting cost reduction accomplished by decreasing the number of mounted part and also miniaturization accomplished by decreasing the mount area in circuit design.

SUMMARY OF THE INVENTION

It is therefore an object of the invention to provide a low-pass filter which enables a decrease in the number of mounted parts in a high-frequency transmission circuit of a digital portable telephone, thereby miniaturizing the circuit and reducing the costs.

To the and, according to the invention, there is provided a low-pass filter used with a high-frequency transmission circuit of a digital portable telephone, the low-pass filter containing a transmission power detection coil magnetically coupled to a coil being contained in a laminate chip for forming said low-pass filter.

In the present invention, the coupler coil magnetically coupled to the low-pass filter coil placed in the laminate chip is contained in the same laminate chip, so that the low-pass filter is also used as a transmission power detection part.

DETAILED DESCRIPTION OF THE PREFERRED EMBODIMENT

Figure 1A:
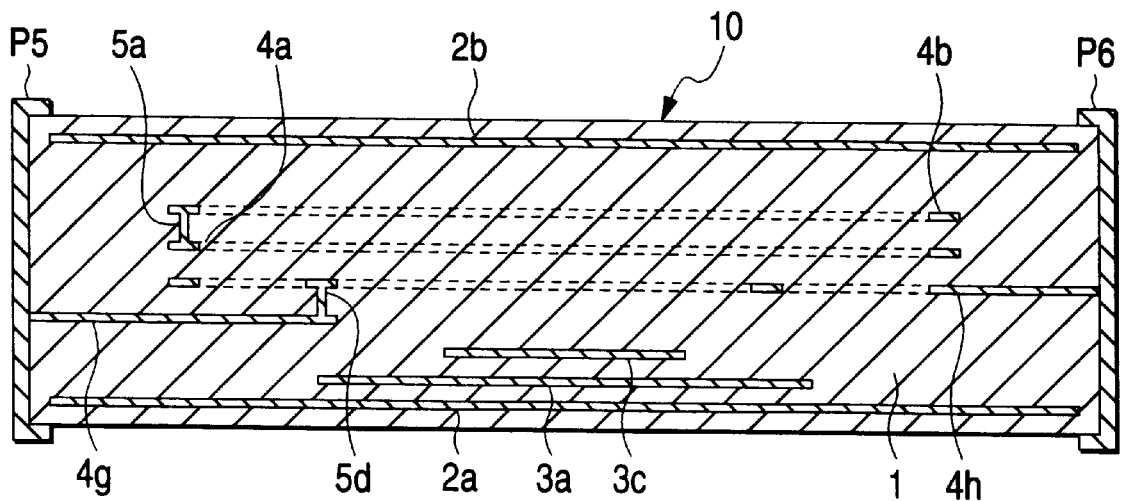
FIG. 1A is a sectional view to show one embodiment of a low-pass filter according to the invention.
Figure 1B:
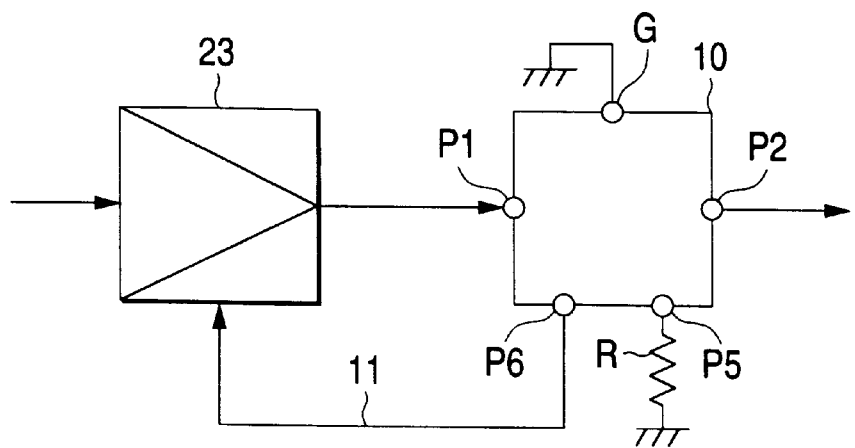
FIG. 1B is a block diagram to show a part of a high-frequency transmission circuit of a portable telephone using the low-pass filter.
Figure 2A:
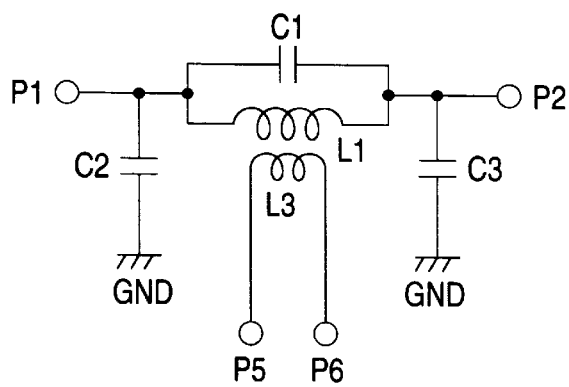
FIG. 2A is a circuit diagram of the low-pass filter of the embodiment.
Figure 2B:
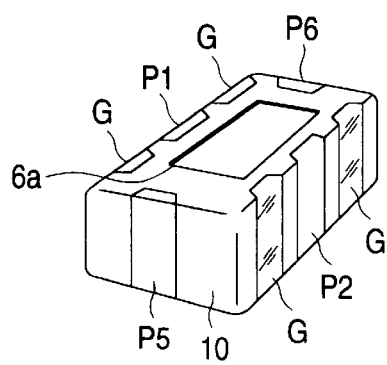
FIG. 2B is a perspective view to show the appearance of the embodiment.
Figure 2C:
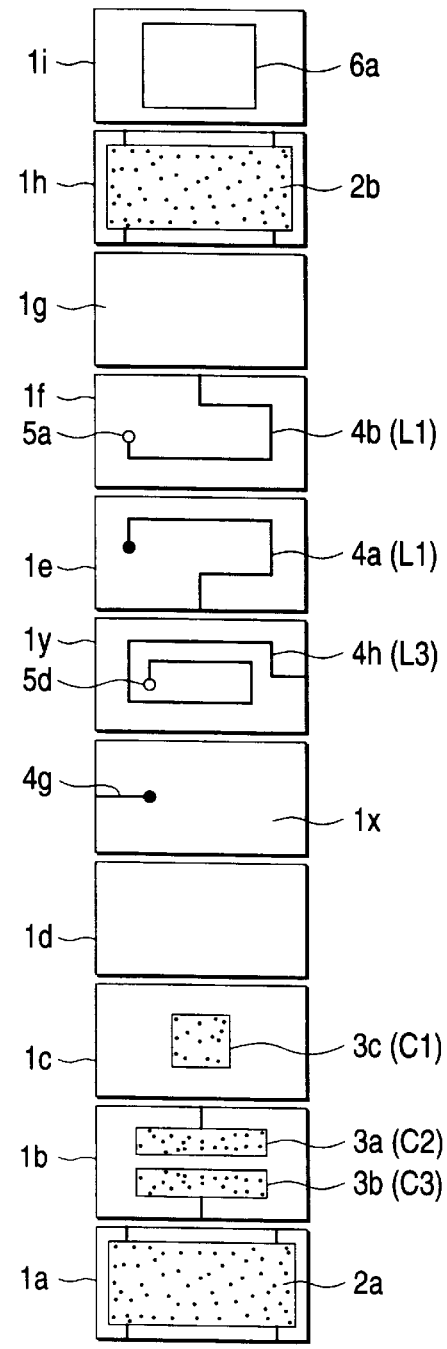
FIG. 2C is a plan view to show the lamination structure of the embodiment.
Figure 3:
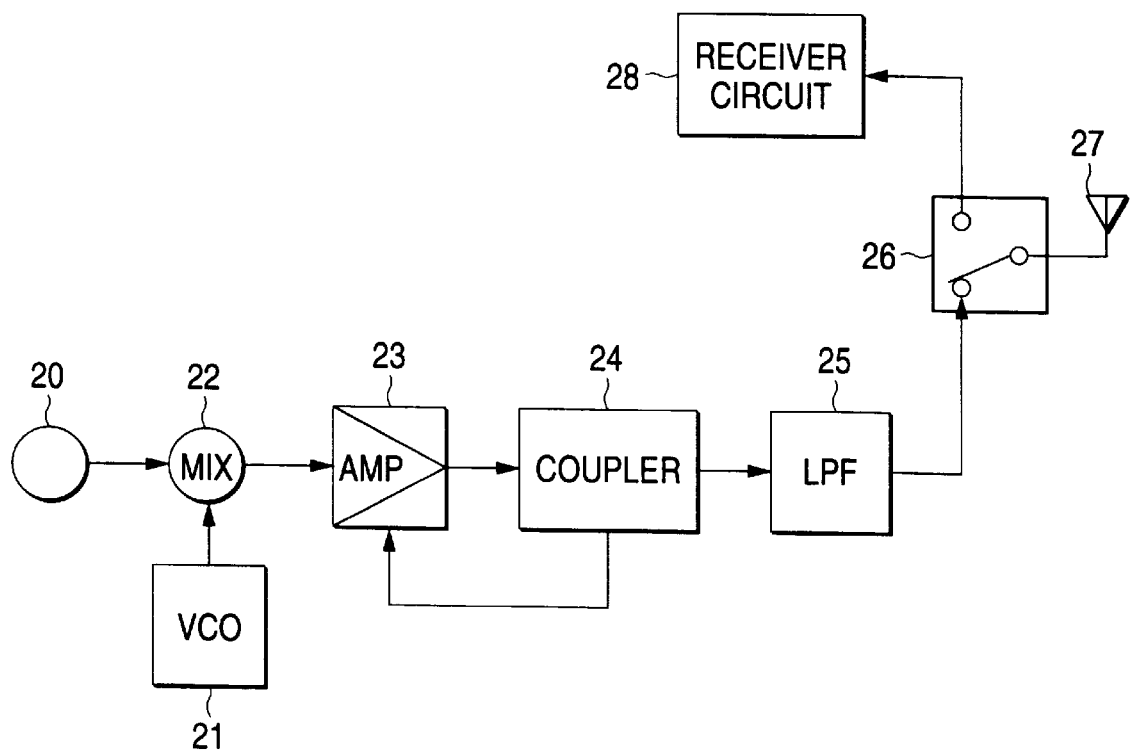
FIG. 3 is a block diagram to show a digital high-frequency transmission circuit.

FIG. 1A is a sectional view to show one embodiment of a low-pass filter according to the invention. FIG. 1B is a block diagram to show a part of a high-frequency transmission circuit of a portable telephone using the low-pass filter. FIG. 2A is a circuit diagram of the low-pass filter of the embodiment. FIG. 2B is a perspective view to show the appearance of the embodiment. FIG. 2C is a plan view to show the lamination structure of the embodiment.

As shown in FIG. 2A, the low-pass filter of the embodiment comprises a parallel circuit of a coil L1 and a capacitor C1 Inserted between an input terminal P1 and an output terminal P2 connected to an output line of a transmission circuit, a capacitor C2 inserted between the input terminal P1 and ground, and a capacitor C3 inserted between the output terminal P2 and ground. It further comprises a transmission power detection coil L3 magnetically coupled to the coil L1 forming the low-pass filter and detection signal output terminals P5 and P6 placed at both ends of the coil L3. In the embodiment, an shown in FIG. 2B, the input terminal P1, the output terminal P2, the detection signal output terminals P5 and P6, and ground terminals G are placed on the side faces of a laminate chip containing the coils L1 and L3 and the capacitors C1–C3, forming the low-pass filter 10.

Figure 4A:
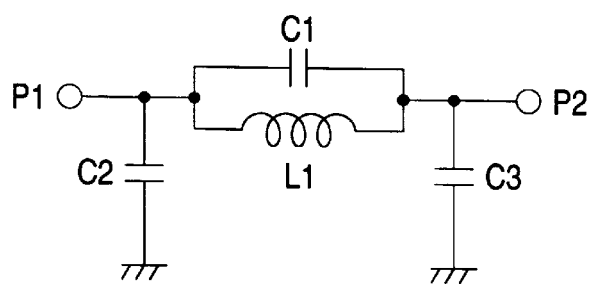
FIG. 4A is a circuit diagram to show a conventional low-pass filter.
Figure 4B:
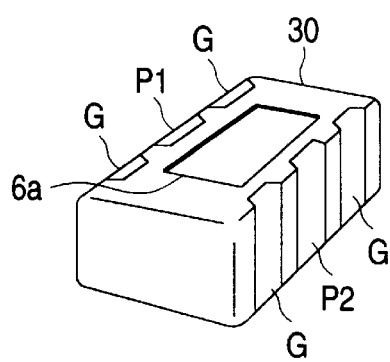
FIG. 4B is a perspective view to show the appearance of the low-pass filter.
Figure 4C:
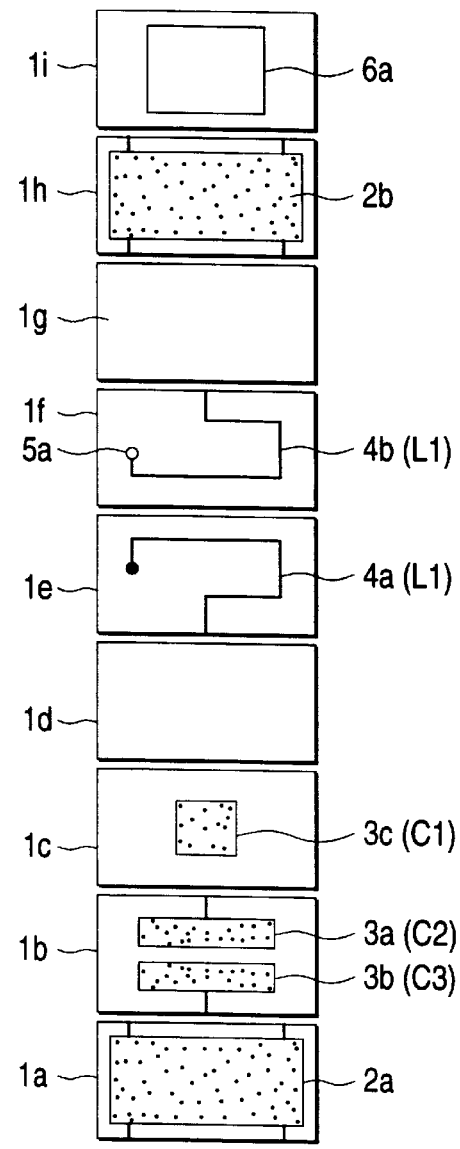
FIG. 4C is a plan view to show the lamination structure of the low-pass filter.
Figure 5A:
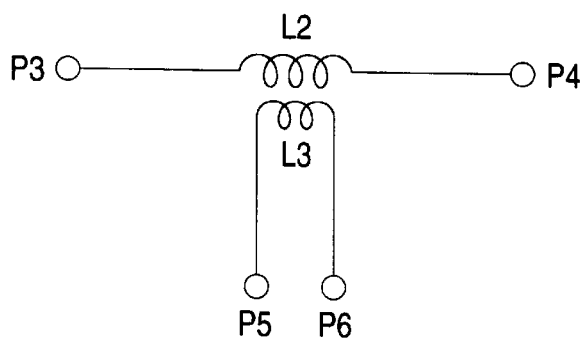
FIG. 5A is a circuit diagram to show a conventional coupler.
Figure 5B:
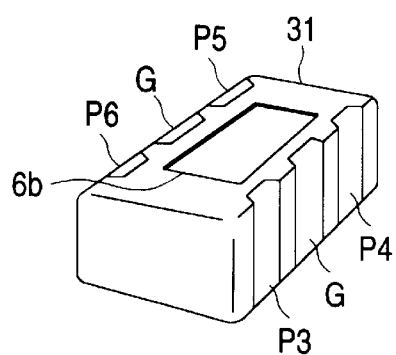
FIG. 5B is a perspective view to show the appearance of the coupler.
Figure 5C:
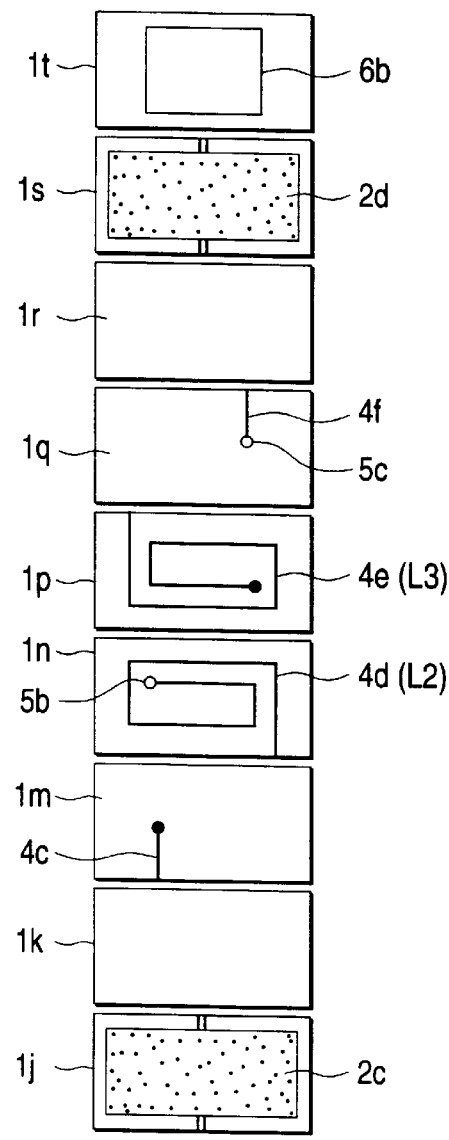
FIG. 5C is a plan view to show the lamination structure of the coupler.

The equivalent circuit shown in FIG. 2A provides a characteristic equivalent to a conventional circuit in that the conventional low-pass filter. (FIG. 4A) and the conventional transmission power detection circuit (FIG. 5A) are serially connected, if values of L, C, and R are properly determined.

Like the conventional low-pass filter, the low-pass filter 10 is manufactured by the print method or the shoot method. An shown in FIG. 2C, to use the sheet method, a dielectric layer 1a on which a ground electrode 2a is printed, a dielectric layer 1b on which capacitor electrodes 3a and 3b forming the capacitor. C2 and C3 facing the ground electrode 2a are printed, a dielectric layer 1c on which a capacitor electrode 3c forming the capacitor C1 facing the capacitor electrodes 3a and 3b is printed, a plurality of dielectric layers 1d forming a gap layer, a dielectric layer 1x on which a leader electrode 4g of the transmission power detection coil L3 in printed, a dielectric layer 1y on which a coil 4h an the main part of the coil L3 is printed, the dielectric layer 1y being formed with a through hole 5d for connecting an end part of the coil 4h to the leader electrode 4g, a dielectric layer 1e on which a coil 4a forming a part of the coil L1 is printed, a dielectric layer 1f on which a coil 4b of the remaining part of the coil L1 is printed, the dielectric layer 1f being formed with a through hole 5a for connecting an end part of the coil 4b to the coil 4a, a plurality of dielectric layers 1g forming a gap layer, a dielectric layer 1h on which a ground electrode 2b is printed, and a dielectric layer 1i formed with a mark 6a and forming a surface protection layer are laminated.

After this, the laminate body is cut for each chip, then the chips are calcined and the terminals P1, P2, P5, P6, and G are disposed on the side faces of each chip by plating or burning, manufacturing products. Here, the ground electrodes 2a and 2b shown in FIG. 2C are connected to the ground terminals G; the capacitor electrodes 3a and 3b are connected to the input terminal P1 and the output terminal P2 respectively; the leader electrode 4g is connected to the detection signal output terminal P5; the coil 4h is connected at one and to the detection signal output terminal P6; and the coils 4a and 4b are connected at an end to the output terminal P2 and the input terminal P1 respectively.

By executing the process, an shown in FIG. 1A, the low-pass filter 10 comprising the transmission power detection coil L3 as well an a coil L1 for the low-pass filter contained in the laminate chip made up of the dielectric layers 1 is provided. The low-pass filter 10 outputs transmission power detection from the detection signal output terminals PS and P6 and also functions as a transmission power detection coupler.

Specifically, an shown in FIG. 1B, one detection signal output terminal P5 is connected to substrate ground via a resistor R of about 50Ω, for example, and predetermined output from the other detection signal output terminal P6 (about −20 dB depending on transmission power) is fed back into a power amplifier 23 over a feedback line 11.

For example, glass-family dielectric material having a comparatively low dielectric constant is used &a the dielectric layers 1a–1y. Silver or its alloy is used for the electrodes 2a, 2b, and 3a–3c, the leader electrode 4g, the coils 4h, 4a, and 4b, etc., but the invention is not limited to the materials.

The low-pass filter of the invention can also be manufactured by the print method. To use the print method, the steps of printing and drying the dielectric layer 1a as a dielectric paste, printing the electrode 2a thereon and drying, printing the dielectric layer 1b as a dielectric paste thereon and drying, printing the electrodes 3a and 3b thereon and drying, . . . are repeated for producing a laminate.

The number of laminated layers of each of the ground electrodes 2a and 2b and the capacitor electrodes 3a and 3b and their shapes, the number of turns of each of the coils 4a, 4b, and 4h and their shapes, the thickness of the dielectric layers 1a–1y, and the like are designed in various ways in response to the required characteristics.

According to the invention, the transmission power detection coil magnetically coupled to the low-pass filter coil placed in the laminate chip is contained in the same laminate chip, thus the number of parts of the high-frequency transmission circuit and the part mount area can be decreased, miniaturizing the circuit. In addition, the number of part mount steps can also be decreased, reducing the costs. Since the coil of the low-pass filter of the laminate chip is also used as the primary coil of the coupler, the object of the invention can be accomplished without enlarging the laminate and without much increasing the number of lamination steps an compared with the came where primary and secondary coils of a coupler are formed separately from a low-pass filter coil and contained in a laminate.

What is claimed is:

1. A low-pass filter comprising:
   a parallel circuit of a first coil and a first capacitor, and disposed between an input terminal and an output terminal;
   a second capacitor disposed between the input terminal and a ground;
   a third capacitor disposed between the output terminal and said ground; and
   a power detection coil magnetically coupled to the first coil, and having ends which comprise detection signal output terminals.

2. A low-pass filter as claimed in claim 1, wherein said low-pass filter has a lamination structure manufactured by one of a print method and a sheet method.

3. A low-pass filter as claimed in claim 2, wherein said input terminal, said output terminal, said detection signal output terminals, and ground terminals are disposed on side faces of said lamination structure.

4. A low-pass filter as claimed in claim 2, wherein said lamination structure comprises:
   a first layer configured to form said first, second, and third capacitors;
   a second layer configured to form said first coil; and
   a third layer configured to form said power detection coil.

5. A low-pass filter as claimed in claim 2, wherein said lamination structure comprises:
   a first dielectric layer having a first ground electrode;
   a second dielectric layer having second and third capacitor electrodes forming said second and third capacitors, and facing the first ground electrode;
   a third dielectric layer having a first capacitor electrode forming the first capacitor, and facing the second and third capacitor electrodes;
   a plurality of fourth dielectric layers configured to form a first gap layer;
   a fifth dielectric layer having a leader electrode of said power detection coil;
   a sixth dielectric layer having a main coil as a main part of said power detection coil, the sixth dielectric layer including a through hole for connecting an end part of the main coil to the leader electrode;
   a seventh dielectric layer having a first part of the first coil;
   an eighth dielectric layer having a second part of the first coil, the seventh dielectric layer including a through hole for connecting an end part of the second part of the first coil to the first part of the first coil;
   a plurality of dielectric layers configured to form a second gap layer;
   a ninth dielectric layer having a second ground electrode; and
   a tenth dielectric layer having a mark and forming a surface protection layer.

6. A low-pass filter used with a high-frequency transmission circuit of a portable telephone, comprising:
   a first coil;
   a transmission power detection coil magnetically coupled to said first coil; and
   a first capacitor connected to a junction of the first coil and the transmission power detection coil,
   wherein said first coil, said transmission power detection coil, and said first capacitor are formed of laminate layers in a same laminate chip.

7. A low-pass filter as claimed in claims further comprising:
   an input and an output terminal connected to respective ends of said coil;
   a second capacitor connected between said input terminal and a ground; and
   a third capacitor connected between said output terminal and said ground,
   wherein said first capacitor is connected in parallel with said first coil.

8. A low-pass filter as claimed in claim 7, further comprising:
   a first layer configured to form said first, second, and third capacitors;
   a second layer configured to form said first coil; and
   a third layer configured to form said power detection coil.

9. A low-pass filter as claimed in claim 7, further comprising:
   a first dielectric layer having a first ground electrode;
   a second dielectric layer having second and third capacitor electrodes forming said second and third capacitors, and facing the first ground electrode;
   a third dielectric layer having a first capacitor electrode forming the first capacitor, and facing the second and third capacitor electrodes;
   a plurality of fourth dielectric layers configured to form a first gap layer;
   a fifth dielectric layer having a leader electrode of said power detection coil;
   a sixth dielectric layer having a main coil as a main part of said power detection coil, the sixth dielectric layer including a through hole for connecting the main coil to the leader electrode;
   a seventh dielectric layer having a first part of the first coil;
   an eighth dielectric layer having a second part of the first coil, the seventh dielectric layer including a through hole for connecting the second part of the first coil to the first part of the first coil;
   a plurality of dielectric layers configured to form a second gap layer;
   a ninth dielectric layer having a second ground electrode; and
   a tenth dielectric layer having a mark and forming a surface protection layer.

10. A low-pass filter as claimed in claim 6, further comprising:
    an input and an output terminal connected to respective ends of said first coil;
    a second capacitor connected in parallel with said first coil; and
    a third capacitor connected between said output terminal and a ground,
    wherein said first capacitor is connected between said input terminal and said ground.

11. A low-pass filter as claimed in claim 10, further comprising:
    a first layer configured to form said first, second, and third capacitors;
    a second layer configured to form said first coil; and
    a third layer configured to form said power detection coil.

12. A low-pass filter as claimed in claim 10, further comprising:
    a first dielectric layer having a first ground electrode;
    a second dielectric layer having first and third capacitor electrodes forming said first and third capacitors, and facing the first ground electrode;
    a third dielectric layer having a second capacitor electrode forming the second capacitor, and facing the first and third capacitor electrodes;
    a plurality of fourth dielectric layers configured to form a first gap layer;
    a fifth dielectric layer having a leader electrode of said power detection coil;
    a sixth dielectric layer having a main coil as a main part of said power detection coil, the sixth dielectric layer including a through hole for connecting the main coil to the leader electrode;

a seventh dielectric layer having a first part of the first coil;

an eighth dielectric layer having a second part of the first coil, the seventh dielectric layer including a through hole for connecting the second part of the first coil to the first part of the first coil;

a plurality of dielectric layers configured to form a second gap layer;

a ninth dielectric layer having a second ground electrode; and a tenth dielectric layer having a mark and forming a surface protection layer.

13. A low-pass filter as claimed in claim 6, further comprising:

an input and an output terminal connected to respective ends of said first coil;

a second capacitor connected in parallel with said first coil; and a third capacitor connected between said input terminal and a ground, wherein said first capacitor is connected between said output terminal and said ground.

14. A low-pass filter as claimed in claim 13, further comprising:

a first layer configured to form said first, second, and third capacitors;

a second layer configured to form said first coil; and a third layer configured to form said power detection coil.

15. A low-pass filter as claimed in claim 13, further comprising:

a first dielectric layer having a first ground electrode;

a second dielectric layer having first and third capacitor electrodes forming said first and third capacitors, and facing the first ground electrode;

a third dielectric layer having a second capacitor electrode forming the second capacitor, and facing the first and third capacitor electrodes;

a plurality of fourth dielectric layers configured to form a first gap layer;

a fifth dielectric layer having a leader electrode of said power detection coil;

a sixth dielectric layer having a main coil as a main part of said power detection coil, the sixth dielectric layer including a through hole for connecting the main coil to the leader electrode;

a seventh dielectric layer having a first part of the first coil;

an eighth dielectric layer having a second part of the first coil, the seventh dielectric layer including a through hole for connecting the second part of the first coil to the first part of the first coil;

a plurality of dielectric layers configured to form a second gap layer;

a ninth dielectric layer having a second ground electrode; and a tenth dielectric layer having a mark and forming a surface protection layer.

16. A low-pass filter as claimed in claim 6, wherein said power detection coil comprises detection signal output terminals.

17. A low-pass filter as claimed in claim 6, further comprising:

input and output terminals connected to respective first and second ends of said first coil; and first and second detection signal output terminals connected to respective first and said ends of said power detection coil, wherein said input and output terminals and said first and second detection signal output terminals are disposed on side surfaces of said laminate chip.

* * * * *